United States Patent
Liu et al.

(10) Patent No.: US 10,451,979 B2
(45) Date of Patent: Oct. 22, 2019

(54) APPARATUS FOR EUV LITHOGRAPHY AND METHOD OF MEASURING FOCUS

(71) Applicant: TAIWAN SEMICONDUCTOR MANUFACTURING CO., LTD., Hsinchu (TW)

(72) Inventors: Yi-Lun Liu, Hsinchu (TW); Ming-Jhih Kuo, Hsinchu County (TW); Yuan-Yen Lo, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/029,391

(22) Filed: Jul. 6, 2018

(65) Prior Publication Data
US 2019/0101836 A1 Apr. 4, 2019

Related U.S. Application Data

(60) Provisional application No. 62/565,664, filed on Sep. 29, 2017.

(51) Int. Cl.
*G03F 7/20* (2006.01)

(52) U.S. Cl.
CPC ...... *G03F 7/70641* (2013.01); *G03F 7/70625* (2013.01)

(58) Field of Classification Search
CPC ............ G03F 7/70433; G03F 7/70625; G03F 7/70683; G03F 7/70641
USPC .............................................. 355/52, 53, 55
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,134,633 B2 | 9/2015 | Lin et al. |
| 9,184,054 B1 | 11/2015 | Huang et al. |
| 9,230,867 B2 | 1/2016 | Cheng et al. |
| 9,256,123 B2 | 2/2016 | Shih et al. |
| 9,304,403 B2 | 4/2016 | Lin et al. |
| 9,404,743 B2 | 8/2016 | Chiu et al. |

(Continued)

FOREIGN PATENT DOCUMENTS

JP 2008-112889 A 5/2008

*Primary Examiner* — Hung Nguyen
(74) *Attorney, Agent, or Firm* — McDermott Will & Emery, LLP

(57) ABSTRACT

A method of evaluating a focus control of an extreme ultraviolet (EUV) lithography apparatus includes preparing a wafer exposed by using the EUV lithography apparatus. The wafer includes test patterns formed of a photoresist and having circular islands or holes prepared by multiple exposures of EUV at different foci of exposure. The method further includes measuring a roughness parameter of the test patterns and estimating a function representing a dependence of the roughness parameter on the focus. A best focus is estimated based on an extremum of the function. Exposure wafers are then exposed to EUV with the best focus. The exposure wafers include the test patterns. The roughness parameter for the test patterns on the exposure wafers obtained by exposing the exposure wafers at the best focus is periodically measured. An abnormality in focus is then determined based on the measured roughness parameter and the function.

20 Claims, 10 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 9,618,837 B2 | 4/2017 | Lu et al. |
| 9,823,585 B2 | 11/2017 | Shih et al. |
| 9,841,687 B2 | 12/2017 | Lee et al. |
| 9,859,139 B2 | 1/2018 | Cheng et al. |
| 9,869,928 B2 | 1/2018 | Huang et al. |
| 9,869,934 B2 | 1/2018 | Huang et al. |
| 9,869,939 B2 | 1/2018 | Yu et al. |
| 2009/0182528 A1* | 7/2009 | De Groot ............... G01B 11/06 702/167 |
| 2016/0238939 A1* | 8/2016 | Brunner ................ G03F 7/2022 |

* cited by examiner

Fig. 2A
Fig. 2B
Fig. 2C
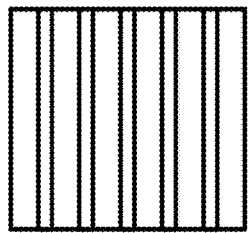
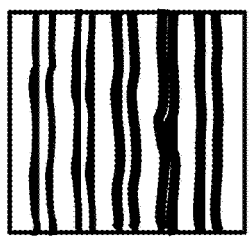
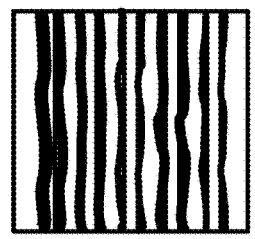
Fig. 2D    Fig. 2E    Fig. 2F    Fig. 2G
Normal             Normal     Fop+90 nm
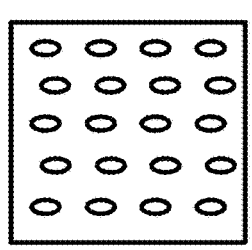
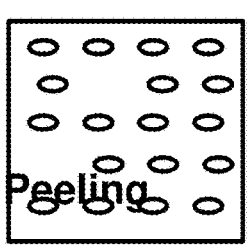
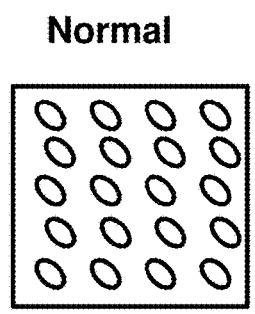
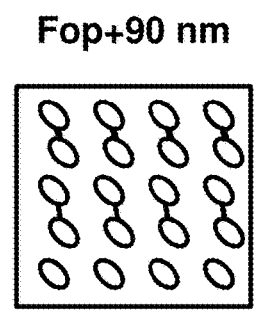

Definition :

$$LWR = \sqrt{\frac{LWR1^2 + LWR2^2 + LWR3^2 + LWR4^2 + \cdots + LWRi^2}{i}}$$

$$\approx \frac{LWR1 + LWR2 + LWR3 + LWR4 + \cdots + LWRi}{i}$$

$$CD = \frac{CD1 + CD2 + \cdots + CDi}{i}$$

$$LCDU = 3 \times \sqrt{\frac{CD1^2 + CD2^2 + \cdots + CDi^2}{i}}$$

$$Cir\text{-}3s = 3 \times \sqrt{\frac{Cir1^2 + Cir2^2 + \cdots + Ciri^2}{i}}$$

APPARATUS FOR EUV LITHOGRAPHY AND METHOD OF MEASURING FOCUS

CROSS REFERENCE TO RELATED APPLICATION(S)

This application claims the benefit of priority to U.S. Provisional Patent Application No. 62/565,664 filed on Sep. 29, 2017, the entire disclosure of which is incorporated herein by reference for all purposes.

TECHNICAL FIELD

This disclosure relates to methods used in controlling an apparatus for lithography, and an apparatus for lithography.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the need to perform higher resolution lithography processes grows, one lithography technique is extreme ultraviolet lithography (EUVL). EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. Additionally, unlike immersion lithography, EUVL scanners operate in vacuum. Conventional techniques using an air gauge or other similar mechanisms may not work for focus monitoring and control in EUV scanners. Alternative techniques for monitoring and maintaining focus of the EUV exposure are, therefore, desirable.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A illustrates a line pattern obtained at optimum focus.

FIG. 2B illustrates a line pattern obtained at a defocus of −50 units.

FIG. 2C illustrates a line pattern obtained at a defocus of +50 units.

FIG. 2D illustrates an example of circular pattern obtained at optimum focus.

FIG. 2E illustrates the effect of defocus on the circular pattern shown in FIG. 2D.

FIG. 2F illustrates another example of circular pattern obtained at optimum focus.

FIG. 2G illustrates the effect of defocus on the circular pattern shown in FIG. 2F.

DETAILED DESCRIPTION

Figure 1:
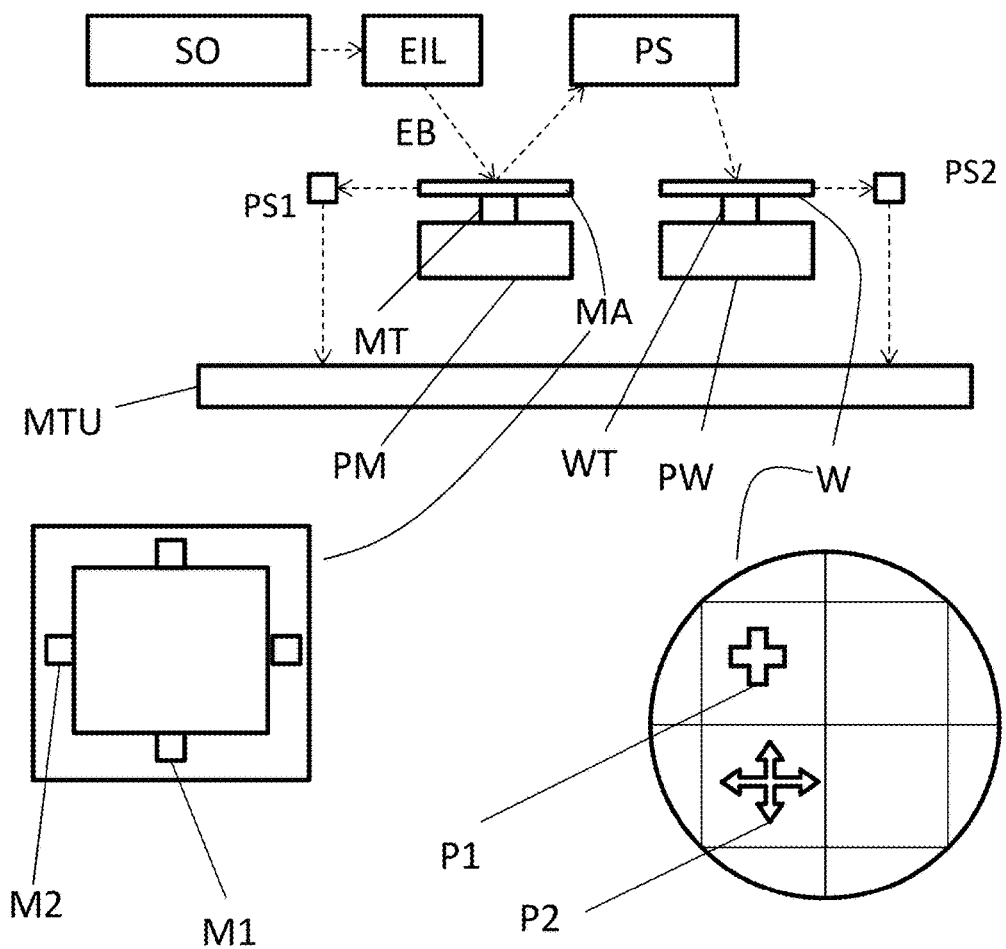
FIG. 1 is a schematic view of an EUV lithography system, in accordance with some embodiments of the present disclosure.

The following disclosure provides many different embodiments, or examples, for implementing different features of the disclosed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to methods and apparatus for monitoring and maintaining quality of focus during EUV lithography process. As a wafer is exposed to EUV during the lithography process, focusing radiation from the EUV source on the wafer surface ensures that the pattern from the mask is reproduced accurately on the wafer. However, as the patterning process continues, the focus may change away from the wafer surface because of various reasons including, but not limited to, movement of the wafer, changes in the radiation path because of movement or heating of the reflecting optics. Additionally, focus may change from wafer to wafer. Maintaining focus through a large batch of wafers is, therefore, challenging. Changes in focus typically result in degradation of the pattern such as loss of edge fidelity and increase in critical dimension. One of the objectives of the present disclosure is directed to measuring quality of focus, enabling the EUV lithography system to take preventive action before the focus degrades to the point of reducing the yield. The general configuration, operation and/or functions of an EUV lithography system are described in US Publication No. 2016/0320708 and US 2016/029753, the entire contents of both of which are incorporated herein by reference.

The lithography system presently described is an extreme ultraviolet (EUV) lithography system designed to expose a resist layer by EUV light (or EUV radiation). The resist layer is a material sensitive to the EUV light. The EUV lithography system employs an EUV radiation source to generate EUV light, such as EUV light having a wavelength ranging between about 1 nm and about 100 nm. In one particular example, the EUV radiation source generates an EUV light with a wavelength centered at about 13.5 nm.

FIG. 1 is a schematic view of an EUV lithography system. The EUV lithography system 100 includes a radiation source device SO, an illumination system (illuminator) EIL configured to condition a radiation beam EB (e.g. EUV radiation), a support structure (e.g. a mask table) MT constructed to support a patterning device (e.g. a mask or a reticle) MA and connected to a first positioner PM configured to accurately position the patterning device, a substrate table (e.g. a wafer table) WT constructed to hold a substrate (e.g. a resist-coated wafer) W and connected to a second positioner PW configured to accurately position the substrate, and a projection system (e.g. a reflective projection system) PS configured to project a pattern imparted to the radiation beam EB by patterning device MA onto a target portion (e.g. comprising one or more dies) of the substrate W.

The support structure MT holds the patterning device MA, in a manner that depends on the orientation of the patterning device MA, the design of the lithographic apparatus, and other conditions, such as, for example, whether or not the patterning device MA is held in a vacuum environment. In various embodiments, the support structure MT uses mechanical, vacuum, electrostatic or other clamping techniques to hold the patterning device MA. In an embodiment, the support structure MT is a frame or a table which is fixed or movable as required. The support structure MT, in an embodiment, ensures that the patterning device MA is at a desired position with respect to the projection system PS.

In the present disclosure, the terms patterning device, mask, photomask, and reticle are used interchangeably and should be broadly interpreted as referring to any device that can be used to impart a radiation beam with a pattern in its cross-section such as to create a pattern in a target portion of the substrate.

Examples of patterning devices include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

It should be noted that the pattern imparted to the radiation beam may not exactly correspond to the desired pattern in the target portion of the substrate, for example, such as where the pattern includes phase-shifting features or so called assist features. Generally, the pattern imparted to the radiation beam will correspond to a particular functional layer in a device being created in the target portion, such as an integrated circuit.

In an embodiment, the mask is a reflective mask. One exemplary structure of a reflective mask includes a substrate formed of a suitable material, such as a low thermal expansion material or fused quartz. In various examples, the material includes $TiO_2$ doped $SiO_2$, or other suitable materials with low thermal expansion. In an embodiment, a mask includes multiple reflective multiple layers (ML) deposited on the substrate. The ML include a plurality of film pairs, such as molybdenum-silicon (Mo/Si) film pairs (e.g., a layer of molybdenum above or below a layer of silicon in each film pair) in some embodiments. In other embodiments, the ML include molybdenum-beryllium (Mo/Be) film pairs, or other suitable materials that are configurable to highly reflect the EUV light. In some embodiments, the mask further includes a capping layer, such as ruthenium (Ru), disposed on the ML for protection. In an embodiment, the mask further includes an absorption layer, such as a tantalum boron nitride (TaBN) layer, deposited over the ML. The absorption layer is patterned to define a layer of an integrated circuit (IC). In some embodiments, another reflective layer is deposited over the ML and is patterned to define a layer of an integrated circuit, thereby forming an EUV phase shift mask.

In some embodiments of EUV lithography system 100, the projection system PS includes various reflective optic components, such as convex/concave/flat mirrors, a mask holding mechanism including a mask stage, and a wafer holding mechanism. The EUV radiation generated by the radiation source SO is guided by the reflective optical components onto a mask secured on the mask stage MT. In some embodiments, the mask stage MT includes an electrostatic chuck (e-chuck) to secure the mask MA. Because gas molecules absorb EUV light, the lithography system for the EUV lithography patterning is maintained in a vacuum or a low pressure environment to avoid EUV intensity loss.

In an embodiment, the lithography system 100 is of a type having two or more substrate support structures, such as substrate stages or substrate tables, and/or two or more support structures for patterning devices. In such a system with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment, one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such an apparatus the additional stages may be used in parallel, or preparatory steps may be carried out on one or more stages while one or more other stages are being used for exposure.

Referring to FIG. 1, the EUV illuminator EIL receives an extreme ultraviolet radiation beam from the radiation source SO. In some embodiments, the EUV illuminator EIL includes an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL, in some embodiments, includes various other components, such as facetted field and pupil mirror devices. In various embodiments, the EUV illuminator EIL is used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device MA. After being reflected from the patterning device MA, the radiation beam EB passes through the projection system PS, which focuses the beam onto a target portion of the substrate W. With the aid of the second positioner PW and a position sensor PS2 (e.g. an interferometric device, linear encoder or capacitive sensor), the substrate table WT can be moved accurately, e.g. so as to position different target portions in the path of the radiation beam EB. Similarly, the first positioner PM and another position sensor PS1 can be used to accurately position the patterning device (e.g. mask) MA with respect to the path of the radiation beam EB. In an embodiment, the patterning device (e.g. mask) MA and substrate W are aligned using mask alignment marks M1, M2 and substrate alignment marks P1, P2.

In addition to a pattern for a desired integrated circuit and the alignment marks, in various embodiments, the target portion includes a test pattern designed to facilitate metrology. In some embodiments, the test pattern includes a 1-D grating, a 2-D grating, circular shapes, or other shapes, or a combination of any of these shapes. The test patterns in various embodiments are designed to be sensitive to specific parameters of the projection system PS such as, for example, focus, chromatic aberration, or dosage. The test patterns may also be designed to provide information about actual critical dimensions (CD), CD uniformity, and placement information of the test pattern (possibly relative to another target). For example, in an embodiment, optical diffraction theory is used to extract information about the CD from the diffraction spectrum of a test pattern. For example, a test pattern including, but not limited to, a 1-D grating which is printed such that, after development, the bars are formed of solid resist lines. In some embodiments, the test pattern is a 2-D grating or an array of circular shapes. In some embodiments, where the test pattern includes an array of circular shapes, the circular shapes have different diameters and are spaced at varying distances from each other. In addition, the pattern with an array of circular shapes is designed to result in an array or islands or an array of holes in an embodiment.

In an embodiment, the EUV lithography system 100 further includes an inspection unit such as, for example, a metrology unit MTU. In some embodiments, the inspection unit is configured to inspect or examine a pattern printed on a wafer produced by the patterning device MA. In order to monitor the lithographic process, the patterned substrate is inspected and one or more parameters of the patterned substrate are measured. The patterned substrate includes a semiconductor substrate with a resist layer in or on which a pattern has been formed using an EUV lithography process. In various embodiments, the resist layer is formed of a material that is sensitive to EUV radiation. In various embodiments, the one or more parameters include, for example, the overlay error between successive layers formed in or on the patterned substrate and/or critical linewidth of the developed photosensitive resist. Various techniques for making measurements of the microscopic structures formed in lithographic processes, include the use of a scanning electron microscope and/or various specialized tools.

A fast and non-invasive form of specialized inspection tool is a scatterometer in which a beam of radiation is directed onto a target on the surface of the substrate and properties of the scattered or reflected beam are measured. By comparing one or more properties of the beam before and after it has been reflected or scattered by the substrate, one or more properties of the substrate can be determined. Two main types of scatterometers are known. A spectroscopic scatterometer directs a broadband radiation beam onto the substrate and measures the spectrum (intensity as a function of wavelength) of the radiation scattered into a particular narrow angular range. An angularly resolved scatterometer uses a relatively narrowband radiation beam and measures the intensity of the scattered radiation as a function of angle of incidence.

For every individual structure in a layer, an acceptable range of an output parameter values associated with the individual structure may be defined. Such output parameters include the CD of the structure. When the individual structure varies within the acceptable range of the output parameter value, the individual structure is not expected to cause the device to be defective. "Defocus window" defines a range within which focus may vary while the output parameter value of the individual structure remains within the acceptable range. It should be noted that focus is merely one of the many processing parameters that affect a lithography process.

One output parameter used to characterize a lithography process is, for example, the width of the smallest features being patterned on a given process layer for a given technology. This minimum dimension is typically referred to as the "critical dimension" or CD. While critical dimensions are actually intended to represent the three dimensional resist profile, the term CD is usually associated with a one-dimensional slice through the resist line, also referred to as the linewidth. In a looser definition, the term CD is often used to refer to the width of the smallest feature for a specific layer of the device or even to any linewidth measurement even if it is not the minimum dimension on the device. For the purposes of the present disclosure, the "critical dimension" or "CD" is not limited to the smallest feature, unless otherwise explicitly indicated.

When wafers or other substrates are illuminated or printed using a lithographic apparatus, ideally, the light-sensitive layer (resist layer) of the wafer should be placed at the focal plane of the projection optics, or a designated location away from the focal plane. However, many factors influence the position of the light-sensitive layer relative to the focal plane. For example, local substrate-height variations, substrate tilt during exposure and imperfect mechanical control of lithographic apparatus influences the relative position of the light-sensitive layer relative to the focal plane. So, often there is a small deviation between the position of the focal plane and the actual position of the light-sensitive layer on the substrate. That deviation is called defocus, focus value, or sometimes just called "defocus," and may be represented by a distance unit, typically in a nanometer range, e.g., 50 nm or less. The defocus values may be local values (e.g. due to substrate-height variations and tilt) which introduces additional imperfections in the imaging path. When defocus occurs, the dimensions of the wafer features that are patterned may not match exactly with the design dimensions.

FIGS. 2A-2C illustrate the effect of deviation in focus from an optimum focus on line patterns obtained with an EUV lithography system, and FIGS. 2D-2F illustrate the effect of deviation in focus from an optimum focus on circular hole or island patterns. As can be seen in FIGS. 2B and 2C, defocus of 50 nm (positive and negative, respectively) from the optimum value (depicted in FIG. 2A) can result in substantial increase in CD values of the resulting pattern. Similarly, defocus can result in a substantial increase in the diameter of the circular patterns. FIGS. 2D-2G additionally illustrate that defocus may enlarge (depicted in FIG. 2G) the circular patterns (depicted in FIG. 2F with optimal focus) in one dimension more than in the other directions, resulting in an elliptical pattern instead of a circular pattern, or resulting in patterns that can peel during development (as depicted in FIG. 2E).

A typical integrated circuit requires several lithography steps, and as seen in FIGS. 2A-2G, deviation in focus can result in imperfect printing of patterns. If the deviation of focus is sufficiently large even in only one of the lithography steps, the dimensions in the resulting pattern may deviate significantly from design dimensions. In certain device or circuit patterns, such deviation may result in catastrophic failure such as, for example, shorting of adjacent conductors, or omission of conductors, rendering the resulting device or circuit non-functional. In other words, if the deviation of focus is more than a particular value (or not within an acceptable focus range) even in one of the exposure steps, production yield may be adversely affected.

Figure 3A:
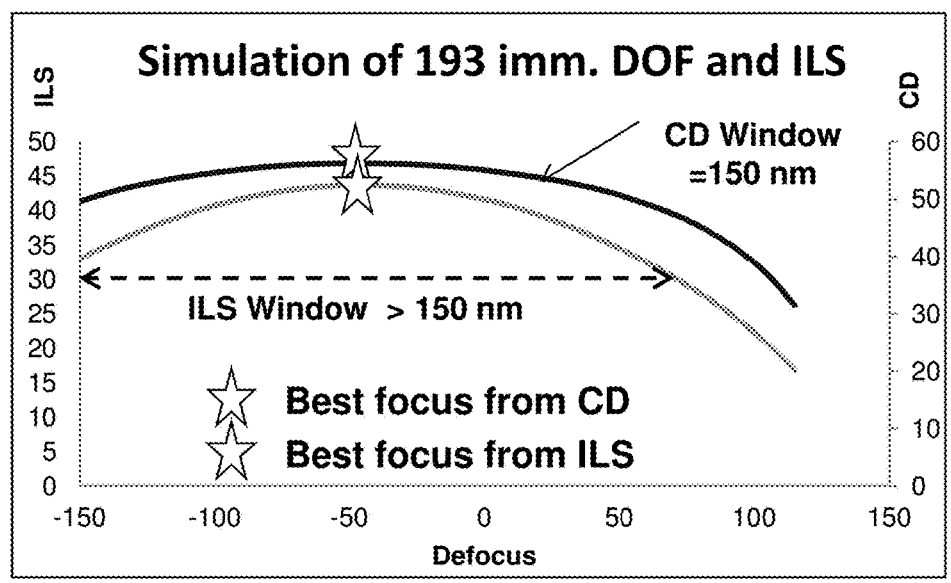
FIG. 3A shows an example of a simulation result representing variation of image log slope (ILS) with deviation of focus from an optimum focus in a commercially available immersion lithography system.
Figure 3B:
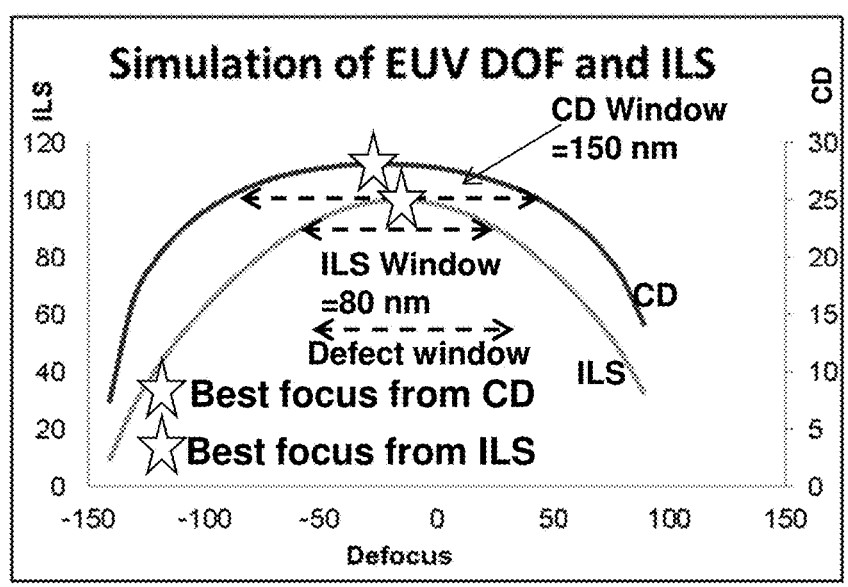
FIG. 3B shows an example of a simulation result representing variation of ILS with deviation of focus from an optimum focus in an EUV lithography system in accordance with some embodiments of the present disclosure.

To determine the best (or optimum) focus, a plot containing the measured CD against the actual measured focus values is generally used. In the semiconductor industry, the variation of the measured CD value through focus for a specific exposure dose typically follows a second order polynomial function as a trend curve, also known as a "Bossung curve". The best focus value typically is located at the minimum value (for transparent structures on the mask) or maximum value (for opaque structures on the mask) of the measured CD through focus. CD is traditionally used for obtaining a Bossung curve. FIG. 3A shows a simulated Bossung curve for an opaque line pattern obtained with a commercially available immersion lithography system. FIG. 3B shows a simulated Bossung curve for an opaque line obtained with an EUV lithography system in accordance with the present disclosure.

Alternatively, in some embodiments, the initial set focus values are replaced by actual measured focus values (not shown) resulting in a more scattered distribution of points along the horizontal axis. To measure the actual focus values in such embodiments, the CD targets used also have specific targets next to the CD target for locally measuring the focus value as would have actually occurred during the lithographic processing of these CD targets (not shown). In other embodiments, instead of CD, other output parameters are used to determine a specific trend-line and instead of varying focus, other processing parameters are used. It will be apparent to the skilled person that this determining of the improved "Bossung curves" using the actual focus measurements instead of the initial set focus measurements may have a wider usage and may be used within and beyond the scope of the current invention, and thus inside and outside the determination of the process window as described in this disclosure.

For immersion lithography, image log slope (ILS) has sometimes been used to obtain the Bossung curve. ILS is an indicator of the sharpness of the edges of individual lines. The sharper the line, the greater the contrast in an image at the line edge, and greater the ILS. As can be seen in FIG. 3A, for immersion lithography, the defect window (or the acceptable defocus window) obtained using ILS is about the same as the defect window obtained using CD.

However, as can be seen in FIG. 3B, for EUV lithography, the focus window (or the acceptable defocus window) obtained using ILS is narrower than the focus window obtained using CD. FIG. 3B illustrates that while a defocus of, for example, 100 nm may result in acceptable CD, ILS at 100 nm defocus may be unacceptably low. In other words, for EUV, CD may not be the best parameter for obtaining an acceptable defocus window.

Alternative parameters for obtaining the best focus and acceptable defocus window are, therefore, explored. These alternative parameters should provide a more accurate acceptable defocus window and a mechanism to monitor focus during lithography operations. In embodiments where a test pattern includes a 1-D grating variation in critical dimension of the test pattern can be represented by line width roughness (LWR) of the test pattern including an array of lines. LWR can, therefore, be a useful parameter for obtaining a more accurate defocus window.

Figure 4A:
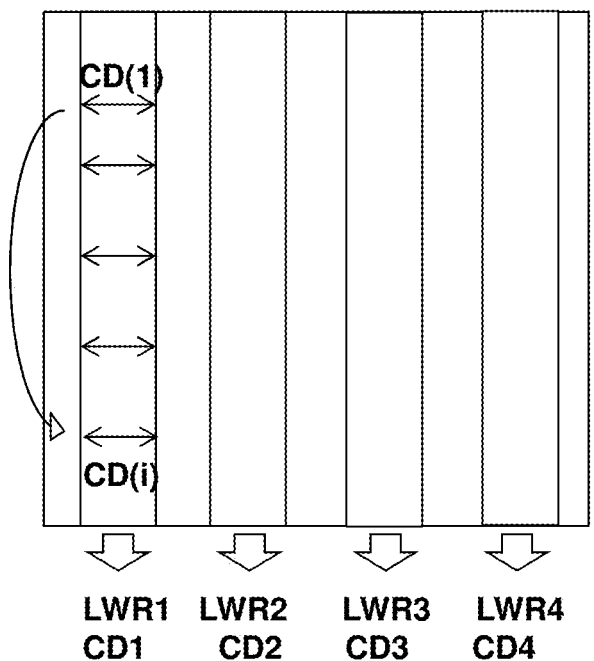
FIG. 4A illustrates a method for measuring the line-width roughness (LWR) of a line pattern obtained using an EUV lithography system in accordance with some embodiments of the present disclosure.

FIG. 4A illustrates how LWR for a test pattern including an array of lines is calculated. First, width of a given line is measured at various points along the line. LWR(i) for that given line ($i^{th}$ line of the pattern) is defined as 3× root-mean-square (RMS) value (3−σ) of the width measured at various points calculated using equation 1 below:

$$LWR(i) = 3\sqrt{\frac{CD(1)^2 + CD(2)^2 + CD(3)^2 + \ldots + CD(n)^2}{n}} \quad \text{Equation 1}$$

Next, LWR for the test pattern is calculated by calculating the RMS value of LWR(i) values for all lines in the test pattern $$LWR = \sqrt{\frac{LWR1^2 + LWR2^2 + LWR3^2 + \ldots + LWRi^2}{i}} \cong \quad \text{Equation 2}$$

$$\frac{LWR1 + LWR2 + LWR3 + \ldots + LWRi}{i}.$$

The RMS value of LWR(i) may be, thus, approximately equal to the average of LWR(i) values.

Figure 5A:
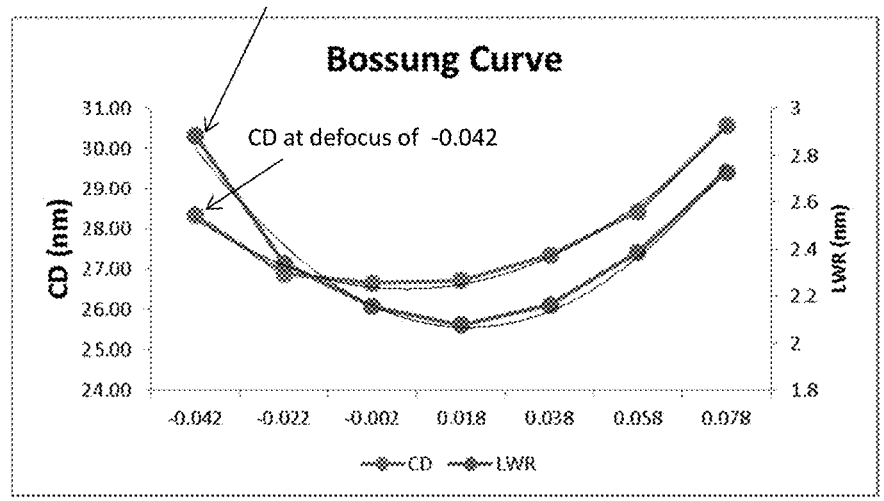
FIG. 5A shows an example of a Bossung curve representing the variation of LWR with deviation of focus from an optimum focus in an EUV lithography system in accordance with some embodiments of the present disclosure.

FIG. 5A shows a Bossung curve obtained using CD and LWR for an EUV lithography system in accordance with the present disclosure. It is evident from FIG. 5A that LWR provides a narrower defocus window than CD. For example, in the embodiment illustrated in FIG. 5A, while a defocus of −0.042 appears to result in an acceptable CD value, the LWR for a defocus −0.042 is unacceptably high. In other words, for a defocus of −0.042, even if the width of a line may be acceptable, the variation in the width may be unacceptably high. As feature sizes reduce, large variations in the line width can potentially result in a catastrophic failure of the device, thereby reducing the overall yield of the fabrication process. Thus, monitoring defocus using LWR rather than CD as a parameter provides more precise monitoring of focus.

In some embodiments, the test pattern includes circular islands or holes. In such embodiments the variation in the critical dimension of the test pattern, i.e., diameter of the circular islands or holes, is represented by the RMS value of the perimeter (Cir-3s) of the circular islands or holes. Those of skill in the art will appreciate that because circular patterns are two dimensional, the variation in the critical dimension in both directions needs to be measured in such embodiments. In other words, the CD in this case includes two values (one for each dimension), and the RMS value of the perimeter represents the variation in both these values together.

Figure 4B:
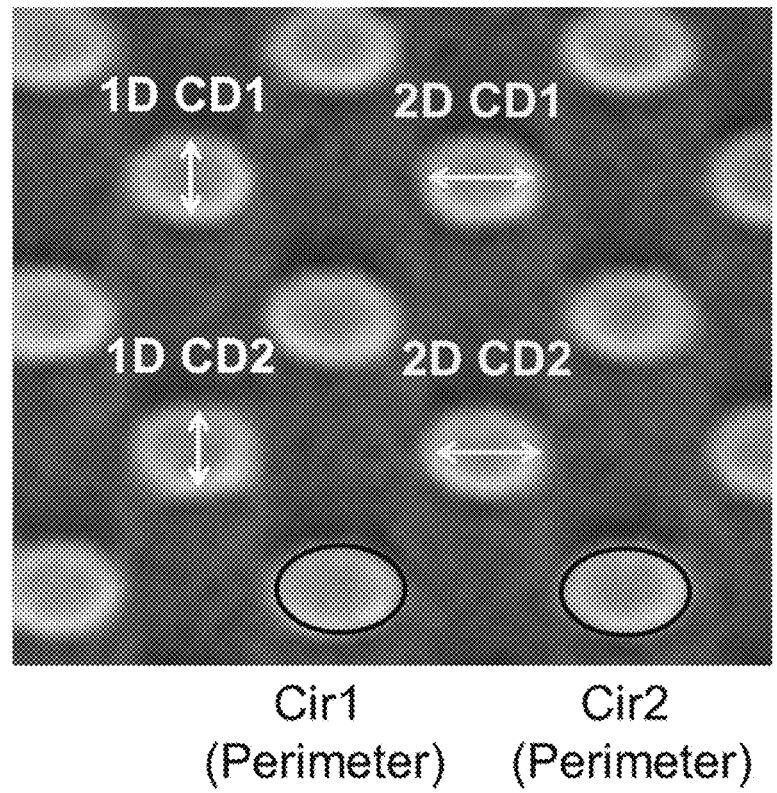
FIG. 4B illustrates a method for measuring the standard deviation of circle perimeter of a circular island/hole pattern obtained using an EUV lithography system in accordance with some embodiments of the present disclosure.

FIG. 4B illustrates how Cir-3s for a test pattern including circular islands or holes is calculated. First, the perimeter (Cir) of the circular patterns (i.e., islands or holes) is measured for individual patterns. Cir-3s is then calculated by calculating 3×RMS value of the perimeter over all the patterns using equation 3 below:

$$Cir\text{-}3s = 3\sqrt{\frac{Cir1^2 + Cir2^2 + Cir3^2 + \ldots + Ciri^2}{i}}. \quad \text{Equation 3}$$

FIG. 4B shows other parameters, viz, 1D-CDU and 2D-CDU which are the 3×RMS value of diameter of the circle in a first direction and in a second direction orthogonal to the first direction, respectively, using equation 4 below:

$$LCDU = 3\sqrt{\frac{CD(1)^2 + CD(2)^2 + CD(3)^2 + \ldots + CD(n)^2}{n}}. \quad \text{Equation 4}$$

Figure 5B:
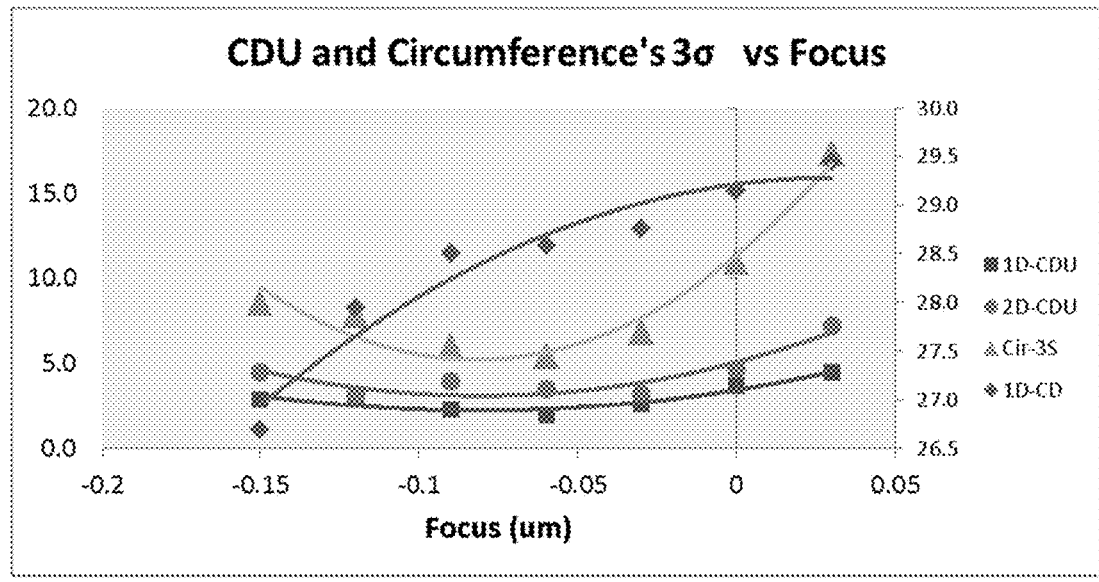
FIG. 5B shows an example of a Bossung curve representing the variation of standard deviation of circle perimeter with deviation of focus from an optimum focus in an EUV lithography system in accordance with some embodiments of the present disclosure.

FIG. 5B shows a comparison between Bossung curves obtained using CD, Cir-3s, 1D-CDU and 2D-CDU. As is evident from FIG. 5B, Cir-3s provides a narrower defocus window than any of CD, 1D-CDU or 2D-CDU.

Figure 6:
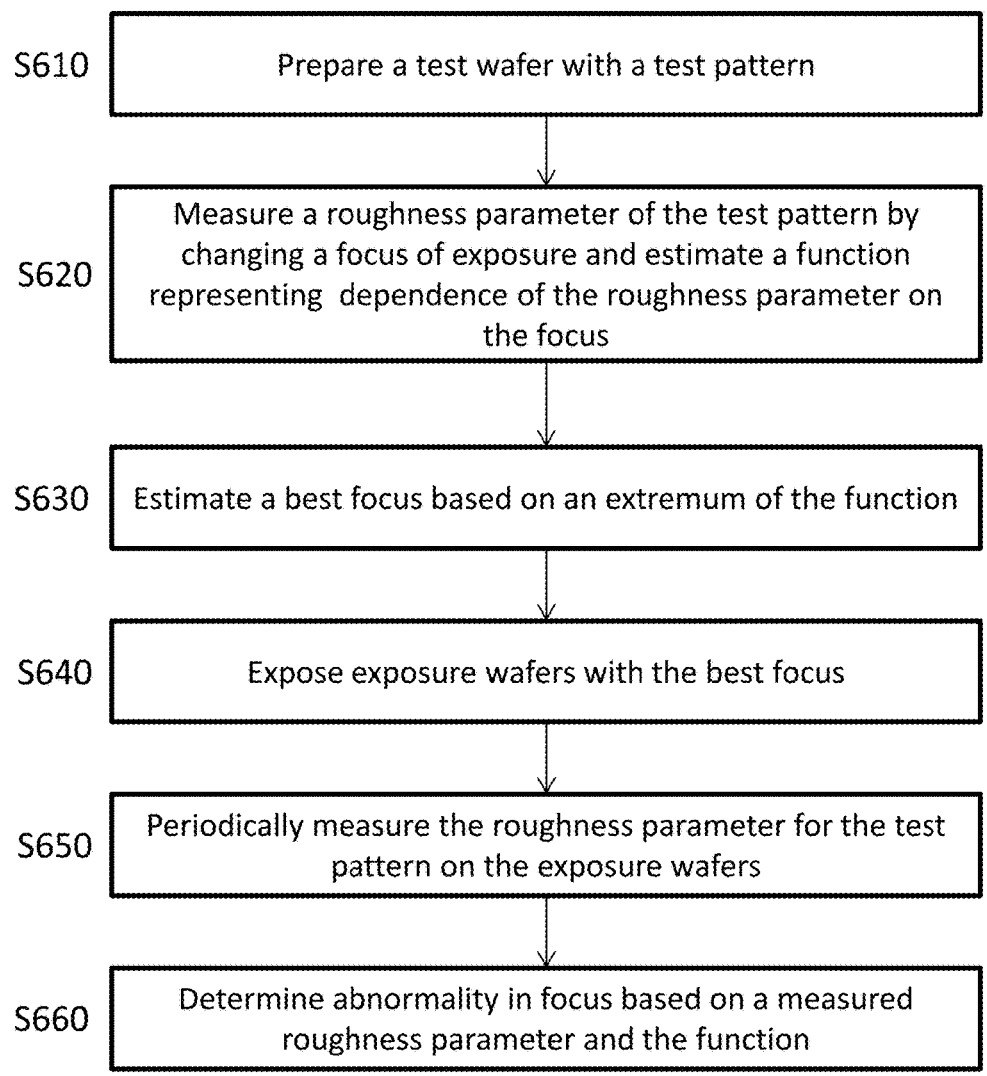
FIG. 6 illustrates a flow chart of a method of determining quality of focus for an EUV lithography apparatus in accordance with an embodiment of the present disclosure.

FIG. 6 illustrates a flow chart of a method of determining the quality of focus for an EUV lithography apparatus in accordance with an embodiment of the present disclosure. According to an embodiment, a method of determining the quality of focus for an extreme ultraviolet (EUV) lithography apparatus includes, at S610, preparing a test wafer exposed by the EUV lithography apparatus. The test wafer includes a resist test pattern. In various embodiments, the test wafer includes a substrate coated with a resist layer sensitive to the EUV radiation. The substrate can be any substrate used in semiconductor manufacturing and may or may not have additional layers coated thereon so long as the top layer is the resist layer. For example, in some embodiments, the substrate is a silicon wafer or a silicon-on-insulator (SOI) wafer. The test wafer may or may not include patterns other than the test pattern in various embodiments. In various embodiments, the resist test pattern includes circular islands or holes.

The method further includes, at S620, measuring a roughness parameter of the test pattern prepared by changing a focus of exposure and estimating a function representing the dependence of the roughness parameter on the focus. The roughness parameter is chosen to be a parameter that represents the variation in the critical dimension of the test pattern. For example, if the test pattern is an array of lines, the roughness parameter is chosen to be the line width roughness (LWR). One method of determining the LWR is illustrated in FIG. 4A and discussed elsewhere herein. For example, the LWR of a line pattern is calculated where the LWR is a root mean square (RMS) of single-line roughness values of lines in the line pattern, wherein the single-line roughness comprises a standard deviation of width values (CD) of a given line measured at distinct points on the given line.

Likewise, if the test pattern includes circular patterns (i.e., islands or holes), the roughness parameter is chosen to be a standard deviation of perimeter of the circular patterns. A method of determining the standard deviation of perimeter of a circular pattern is illustrated in FIG. 4B and discussed elsewhere herein.

At S630, a best focus is estimated based on an extremum of the function. In an embodiment, depending on the roughness parameter chosen, the function includes a second degree polynomial.

The method then continues to S640, where the exposure wafers are exposed with the best focus. The exposure wafers include the test pattern. In various embodiments, the test pattern included on the exposure wafers is identical to the one included for the test wafers at S610. In some embodiments, additional test patterns can be included on exposure wafers. For example, in an embodiment, the test pattern on the test wafers includes circular patterns (i.e., islands or holes), whereas the test pattern on the exposure wafers includes identical circular patterns and an array of lines, or a plurality of concentric "+" marks with increasing sizes, or other patterns representing critical features in a device pattern.

In various embodiments, the exposure wafers additionally include device patterns. In various embodiments, device patterns on exposure wafers are exposed at the same time (or in the same process step) as the test patterns. The exposure wafers, like the test wafers, are wafers used in semiconductor manufacturing processes and include a substrate and a resist layer as the top layer. The resist layer in an embodiment is sensitive to EUV radiation. In some embodiments, multiple other layers are present between the substrate and the resist layer. The substrate, in some embodiments, is a silicon wafer or a SOI wafer (or any other semiconductor substrate wafer).

The method further includes, at S650, periodically measuring the roughness parameter for the test pattern on the exposure wafers obtained by exposing the exposure wafers at the best focus. In various embodiments, the measuring the roughness parameter is performed once for each of the exposure wafers or once for a batch of exposure wafers. In an embodiment, the measurement of the roughness parameter is performed by imaging the pattern formed after developing the exposed resist by, for example, a scanning electron microscope. Other methods of measuring the roughness parameter such as, for example, scanning probe microscopy, X-ray scatterometry, evanescent field excitation imaging, etc. are contemplated.

An abnormality in focus is then determined at S660 based on the measured roughness parameter and the function. Abnormality, as used herein, refers to unexpected or unanticipated change or variation in focus. An acceptable range of focus defines an acceptable defocus window. Thus, if the change in focus (or abnormality in focus) is within the acceptable defocus window, no change to the system may be needed. In other words, the determination of abnormality in focus need not necessarily require a correction in all instances. In other instances, the abnormality in focus is outside an acceptable range, or outside the defocus window. In such instances, an appropriate correction to the system may be needed. Determination of whether the abnormality in focus is acceptable is made based on whether the measured roughness parameter is within an acceptable range.

Figure 7:
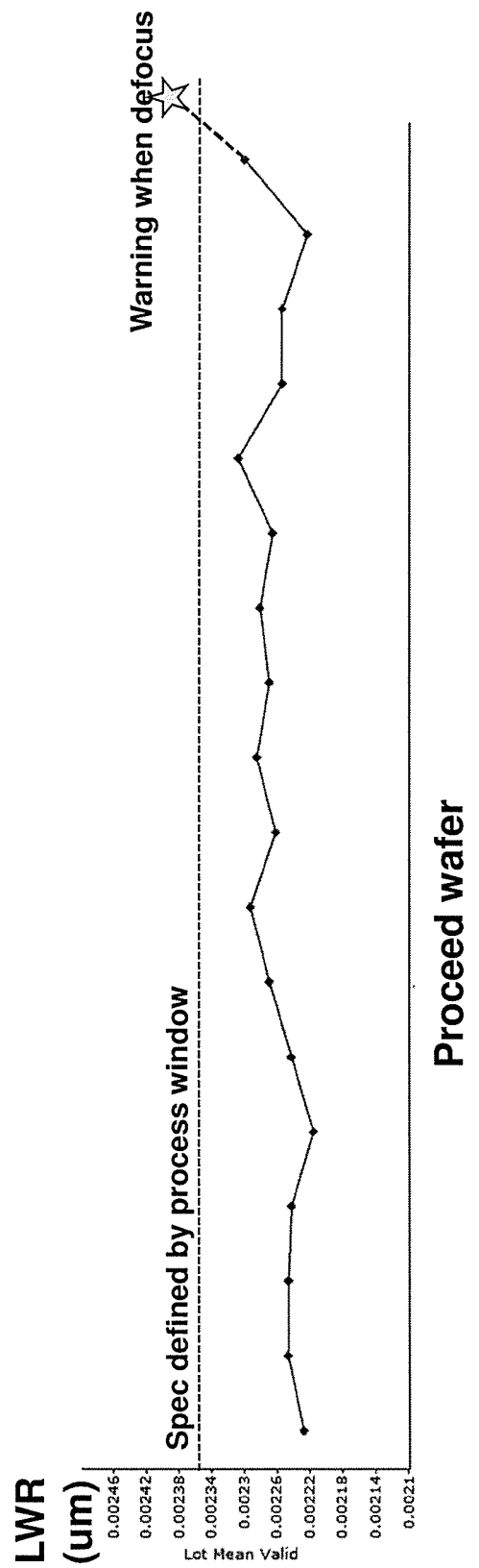
FIG. 7 shows an example of a defocus window representing an acceptable focus range for an EUV lithography system in accordance with some embodiments of the present disclosure.

For example, FIG. 7 shows an example of a defocus window representing an acceptable focus range based on measured LWR values in accordance with some embodiments of the present disclosure. When the measured LWR is less than a predetermined threshold value, the abnormality in focus is deemed to be acceptable. In other words, the focus, in such instances, lies within the defocus window. On the other hand, when the measured LWR is greater than the predetermined threshold, the abnormality in focus is deemed to be unacceptable. In other words, the focus in such instances lies outside the defocus window and requires an appropriate correction.

In various embodiments, in response to a determination that the measured roughness parameter is outside the acceptable range, a warning signal is provided alerting a user of the EUV lithography system that the focus has moved outside the defocus window. In some embodiments, additional predetermined actions are performed in response to warning signal. For example, in an embodiment, production using the EUV system is stopped in response to the warning signal. In other embodiments, actions are taken for obtaining the focus within an acceptable focus range. In various embodiments, the actions to obtain the focus within the acceptable focus range (i.e., within the defocus window) include repeating a process of changing focus, measuring the roughness parameter and determining whether the roughness parameter is within the acceptable roughness parameter range. In various embodiments, the acceptable roughness parameter range is from about 0.05 nm to about 5 nm depending on the size and shape of the features in the device pattern(s) to be exposed.

Figure 8:
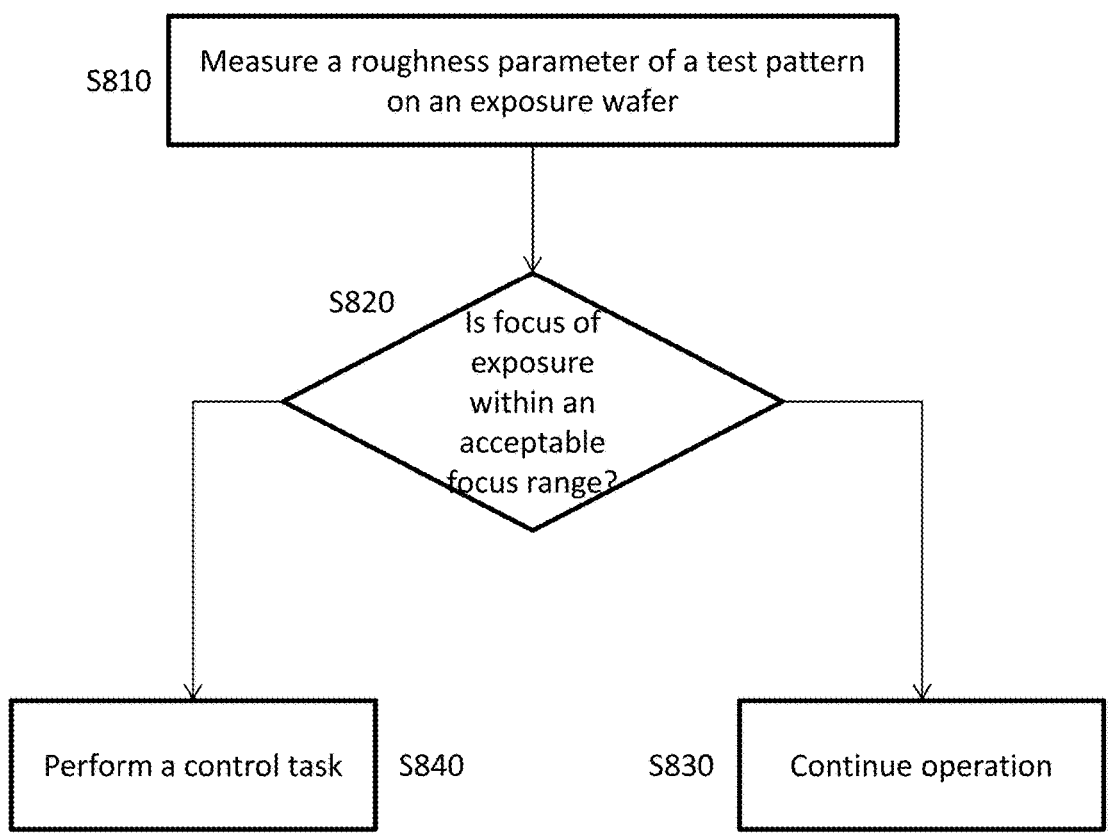
FIG. 8 shows a flow chart of a method of controlling an EUV lithography process in accordance with an embodiment of the present disclosure.

FIG. 8 shows a flow chart of a method of controlling an EUV lithography process in accordance with an embodiment of the present disclosure. In an embodiment, the method includes, at S810, measuring a roughness parameter of a test pattern on an exposure wafer exposed by EUV in an EUVL apparatus. As discussed elsewhere herein, in some embodiments, the test pattern includes circular islands or holes and the roughness parameter is calculated by calculating the standard deviation of the perimeter of the circular islands or holes. In some embodiments, the test pattern alternatively or additionally includes a line pattern. The roughness parameter for a line pattern is calculated by calculating the line-width roughness (LWR) of the line pattern, the LWR being a root mean square (RMS) of single-line roughness values of lines in the line pattern. The single-line roughness includes the standard deviation of width values (CD) of a given line measured at distinct points on the given line.

Measuring the roughness parameter, in various embodiments, is performed using techniques such as, for example, scanning electron microscopy (SEM), scanning probe microscopy, X-ray scatterometry, evanescent field excitation imaging, etc.

At S820, it is determined whether the focus of exposure by the EUV source is within an acceptable focus range based on the measured roughness parameter. In various embodiments, depending on the size and shape of a device pattern to be exposed on an exposure wafer, the acceptable roughness parameter is in a range from about 0.05 nm to about 5 nm.

In an embodiment, the determining whether the focus of exposure by the EUV source is within an acceptable focus range is determined by estimating a function representing the dependence of the roughness parameter on the focus by exposing the test pattern on a test wafer at different focuses of exposure and measuring the roughness parameter for each of the different focuses of exposure, and estimating a best focus based on an extremum of the function. The exposure wafer is then exposed at the estimated best focus and the roughness parameter for the test pattern on the exposure is measured periodically. The focus of exposure is then determined based on the measured roughness parameter and the function. In various embodiments, the function representing the dependence of the roughness parameter on the focus includes a second degree polynomial. In some embodiments, the periodicity of measurement of focus on the exposure wafer is once for the exposure wafer or once for a batch of exposure wafers.

If it is determined that the focus is within the acceptable focus range, the operation of the EUV lithography system is continued, at S830, without any correction. On the other hand, if it is determined that the focus is outside the acceptable focus range, at S840, a control task is performed. The control task, in various embodiments, includes stopping the EUV lithography process. In other embodiments, the control task includes obtaining focus within the acceptable focus range. This is achieved, in an embodiment, by iteratively changing focus, measuring the roughness parameter and determining whether the roughness parameter is within an acceptable roughness parameter range.

Figure 9:
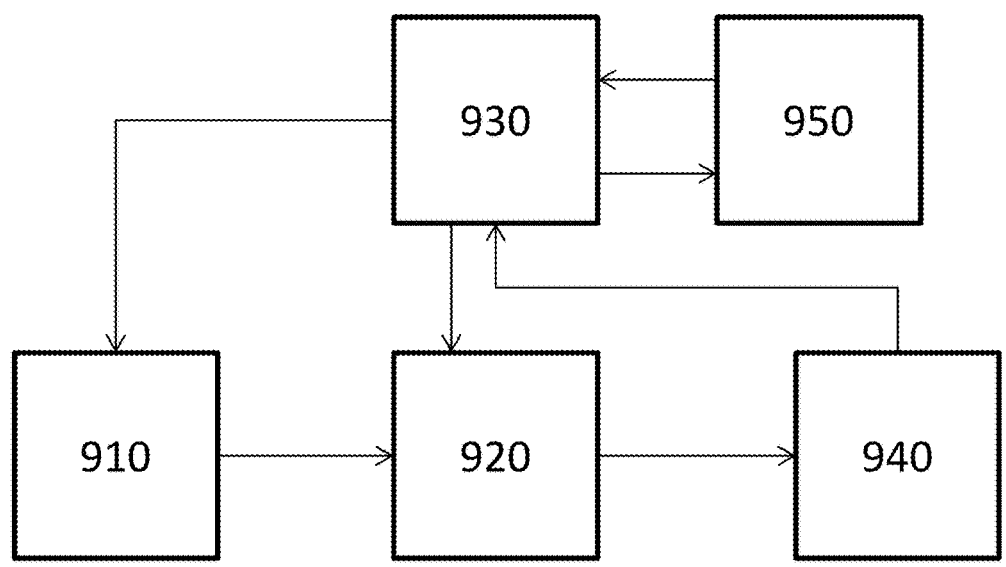
FIG. 9 schematically depicts an apparatus for EUV lithography in accordance with an embodiment of the present disclosure.

FIG. 9 schematically depicts an apparatus for EUV lithography in accordance with an embodiment of the present disclosure. In an embodiment, the apparatus includes an EUV radiation source 910, a wafer holder 920 configured to hold a wafer to be exposed to EUV radiation from the EUV radiation source 910, a controller 930 configured to control the apparatus based on a quality of focus of exposure on the wafer, a metrology unit 940 operatively connected to the controller and configured to measure parameters of a pattern on the wafer, and a computer-readable storage 950.

For the purposes of simplicity of description, the EUV radiation source 910 will be understood to include the focusing optics for the purposes of the discussion below. The details of the focusing optics have been described elsewhere herein. Likewise, the details of the EUV radiation source 910 and the wafer holder 920 have also been described elsewhere herein. The metrology unit 940 is configured to measure parameters, such as, for example, the roughness parameter discussed elsewhere herein. In various embodiments, the metrology unit 940 performs these measurements using well-established techniques such as, for example, SEM, SPM, X-ray scatterometry, etc. Where the metrology unit 940 may perform these measurements using a non-conventional technique such as, for example, evanescent field excitation imaging, the details of apparatus performing such non-conventional techniques are omitted for the purposes of brevity as they are not the subject of this disclosure. In other words, the details of the metrology unit 940 are not limiting to this disclosure so long as the metrology unit 940 is able to reliably measure parameters such as, for example, the roughness parameter described herein.

The controller 930, in various embodiments, includes one or more processor and one or more transceivers configured to transmit and/or receive signals from other units of the apparatus operatively connected to the controller 930 including, but not limited to the EUV radiation source 910, the wafer holder 920, the metrology unit 940 and the computer-readable storage 950 as depicted in FIG. 9. In an embodiment, the controller 930 includes a suitably-programmed general purpose computer comprising a central processing unit. In other embodiments, the controller 930 includes a special-purpose computer suitably programmed to carry out certain instructions.

The computer-readable storage 950 includes instructions configured to cause the controller 930 to cause the metrology unit 940 to measure a roughness parameter of a test pattern prepared by changing a focus of exposure on the wafer and estimating a function representing the dependence of the roughness parameter on the focus. The controller 930 is then caused to estimate a best focus based on an extremum of the function. The instructions further cause the metrology unit 940 to periodically measure the roughness parameter for the test pattern on the wafer obtained by exposing the wafer at the best focus. The instructions then cause the controller 930 to determine an abnormality in focus based on the measured roughness parameter and the function.

As discussed elsewhere herein, the test pattern, in various embodiments, includes circular islands or holes. The roughness parameter in such cases includes a standard deviation of the perimeter of the circular islands or holes. In some embodiments, the test pattern alternatively and/or additionally includes a line pattern. The roughness parameter in such cases include the line-width roughness (LWR) of the line pattern, the LWR being a root mean square (RMS) of the single-line roughness values of lines in the line pattern. The single-line roughness includes the standard deviation of width values (CD) of a given line measured at distinct points on the given line.

In some embodiments, additional instructions configured to cause the controller 930 to perform a predetermined action in response to a determination that the measured roughness parameter is outside an acceptable roughness parameter range are included in the computer storage 950. The predetermined action, in an embodiment, includes stopping the apparatus. In other embodiments, the predetermined action includes obtaining the focus within an acceptable focus range by iteratively changing the focus, measuring the roughness parameter and determining whether the roughness parameter is within the acceptable roughness parameter range.

Using the presently disclosed methods and apparatuses, the yield of a semiconductor manufacturing process using EUV lithography can be improved by monitoring variation and quality of focus and, if necessary, intervening at an appropriate time to correct for an unacceptable variation in focus.

It will be understood that not all advantages have been necessarily discussed herein, no particular advantage is required for all embodiments or examples, and other embodiments or examples may offer different advantages.

According one aspect of the present disclosure, a method of evaluating a focus control of an extreme ultraviolet (EUV) lithography apparatus includes preparing a wafer exposed by using the EUV lithography apparatus. The wafer includes test patterns formed of a photoresist and having circular islands or holes prepared by multiple exposures of EUV at different foci of exposure. The method further includes measuring a roughness parameter of the test patterns and estimating a function representing a dependence of the roughness parameter on the focus. A best focus is estimated based on an extremum of the function. Exposure wafers are then exposed to EUV with the best focus. The exposure wafers include the test patterns. The roughness parameter for the test patterns on the exposure wafers obtained by exposing the exposure wafers at the best focus is periodically measured. An abnormality in focus is then determined based on the measured roughness parameter and the function. In one or more of the foregoing or following embodiments, the roughness parameter is calculated by calculating a standard deviation of a perimeter of the circular islands or holes. In an embodiment, the test pattern further includes a line pattern. In such embodiments, the roughness parameter is calculated by calculating a line-width roughness (LWR) of the line pattern, the LWR being a root mean square (RMS) of single-line roughness values of lines in the line pattern. The single-line roughness includes a standard deviation of width values (CD) of a given line measured at distinct points on the given line. In some embodiments, the function is a second degree polynomial. In an embodiment, the method further includes providing a warning signal in response to a determination that the measured roughness parameter is outside an acceptable roughness parameter range. In some embodiments, the method further includes performing a predetermined action in response to the warning signal. The predetermined action in some embodiments includes (a) stopping production, or (b) obtaining the focus within an acceptable focus range by iteratively changing the focus of exposure, measuring the roughness parameter and determining whether the roughness parameter is within the acceptable roughness parameter range. In various embodiments, the acceptable roughness parameter range is from 0.05 nm to 5 nm. In some embodiments, the measuring the roughness parameter is performed once for each of the exposure wafers or once for a batch of exposure wafers.

According to another aspect of the present disclosure, a method of controlling an extreme ultraviolet (EUV) lithography process includes measuring, in operation of an EUV lithography apparatus comprising an EUV source, a roughness parameter of a test pattern on an exposure wafer. The test pattern includes circular islands or holes. The roughness parameter includes a standard deviation of a perimeter of the circular islands or holes. The method further includes determining, in operation of the EUV lithography apparatus, whether a focus of exposure by the EUV source is within an acceptable focus range based on the measured roughness parameter. In response to a determination that the focus is outside the acceptable focus range, a control task is performed. The control task includes (a) stopping the EUV lithography process, or (b) obtaining the focus within the acceptable focus range by iteratively changing the focus of exposure, measuring the roughness parameter and determining whether the roughness parameter is within an acceptable roughness parameter range. In one or more of the foregoing or following embodiments, the method further includes estimating a function representing dependence of the roughness parameter on the focus by exposing the test pattern on a test wafer at different focuses of exposure and measuring the roughness parameter for each of the different focuses of exposure. A best focus is then estimated based on an extremum of the function. In some embodiments, the method further includes exposing the exposure wafer at the estimated best focus. In an embodiment, the determining whether the focus of exposure is within an acceptable range includes periodically measuring, in the operation of the EUV lithography apparatus, the roughness parameter for the test pattern on the exposure wafer, and determining, in the operation of the EUV lithography apparatus, the focus of exposure based on the measured roughness parameter and the function. In various embodiments, the measuring the roughness parameter is performed once for the exposure wafer or once for a batch of exposure wafers. In some embodiments, the function includes a second degree polynomial. In an embodiment, the acceptable roughness parameter range is from 0.05 nm to 5 nm. In various embodiments, the test pattern further includes a line pattern. The roughness parameter in such embodiments is calculated by calculating a line-width roughness (LWR) of the line pattern, the LWR being a root mean square (RMS) of single-line roughness values of lines in the line pattern. The single-line roughness includes a standard deviation of width values (CD) of a given line measured at distinct points on the given line.

According yet another aspect of the present disclosure, an apparatus for extreme ultraviolet (EUV) lithography includes an EUV radiation source, a wafer holder configured to hold a wafer to be exposed to EUV radiation from the EUV radiation source, a controller configured to control the apparatus for EUV lithography based on a quality of a focus of exposure on the wafer, a metrology unit operatively connected to the controller and configured to measure parameters of a pattern on the wafer, and a computer-readable storage. The computer-readable storage includes instructions configured to cause the controller to cause the metrology unit to measure a roughness parameter of a test pattern prepared by multiple exposures of EUV at different foci of exposure and estimating a function representing a dependence of the roughness parameter on the focus. The instructions further cause the controller to estimate a best focus based on an extremum of the function. The instructions then cause the controller to cause the metrology unit to periodically measure the roughness parameter for the test pattern on the wafer obtained by exposing the wafer at the best focus. The instructions then cause the controller to determine an abnormality in focus based on the measured roughness parameter and the function. In one or more of the foregoing or following embodiments, the test pattern includes includes an EUV radiation source, a wafer holder configured to hold a wafer to be exposed to diation from the EUV radiation source, a controller configured to coern further includes a line pattern. In such embodiments, the roughness parameter further includes a line-width roughness (LWR) of the line pattern, the LWR being a root mean square (RMS) of single-line roughness values of lines in the line pattern. The single-line roughness includes a standard deviation of width values (CD) of a given line measured at distinct points on the given line. In some embodiments, the computer-readable storage further include instructions configured to cause the controller to perform, in response to a determination that the measured roughness parameter is outside an acceptable roughness parameter range, a predetermined action. The predetermined action includes: (a) stopping the apparatus, or (b) obtaining the focus within an acceptable focus range by iteratively changing focus, measuring the roughness parameter and determining whether the roughness parameter is within the acceptable roughness parameter range. In various embodiments, the roughness parameter is measured once for the exposure wafers or once for a batch of exposure wafers. In an embodiment, the function includes a second degree polynomial.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of evaluating a focus of exposure of an extreme ultraviolet (EUV) lithography apparatus, the method comprising:
preparing a wafer exposed using the EUV lithography apparatus, the wafer comprising test patterns formed of a photoresist and comprising circular islands or holes produced by multiple exposures of EUV at different foci of exposure;
measuring a roughness parameter comprising a standard deviation of variations of a perimeter of the circular islands or holes of the test patterns produced by the multiple exposures of EUV and estimating a function representing a dependence of the roughness parameter on the focus of exposure;
estimating a best focus based on an extremum of the function;
exposing exposure wafers to EUV with the best focus, the exposure wafers comprising the test patterns;
periodically measuring the roughness parameter for the test patterns on the exposure wafers obtained by exposing the exposure wafers at the best focus; and
determining an abnormality in focus based on the measured roughness parameter and the function.

2. The method of claim 1, wherein the test patterns further comprise line patterns and the roughness parameter further comprises a line-width roughness (LWR) of the line patterns calculated using equation 1 below:

$$LWR = \sqrt{\frac{LWR1^2 + LWR2^2 + LWR3^2 + \ldots + LWRi^2}{i}} \cong \frac{LWR1 + LWR2 + LWR3 + \ldots + LWRi}{i}, \quad \text{Equation 1}$$

the LWR being a root mean square (RMS) of single-line roughness values of lines in the line patterns, wherein the single-line roughness comprises a standard deviation of width values (CD) of a given line measured at distinct points on the given line calculated using equation 2 below:

$$LWR(i) = 3\sqrt{\frac{CD(1)^2 + CD(2)^2 + CD(3)^2 + \ldots + CD(n)^2}{n}}. \quad \text{Equation 2}$$

3. The method of claim 1, wherein the function comprises a second degree polynomial.

4. The method of claim 1, further comprising providing a warning signal in response to a determination that the measured roughness parameter is outside an acceptable roughness parameter range.

5. The method of claim 4, further comprising performing a predetermined action in response to the warning signal, wherein the predetermined action comprises (a) stopping production, or (b) obtaining the focus within an acceptable focus range by iteratively changing the focus of exposure, measuring the roughness parameter and determining whether the roughness parameter is within the acceptable roughness parameter range.

6. The method of claim 4, wherein the acceptable roughness parameter range is from 0.05 nm to 5 nm.

7. The method of claim 1, wherein the measuring the roughness parameter is performed once for each of the exposure wafers or once for a batch of exposure wafers.

8. A method of controlling an extreme ultraviolet (EUV) lithography process, the method comprising:
measuring, in operation of an EUV lithography apparatus comprising an EUV source, a roughness parameter of a test pattern on an exposure wafer, the test pattern being made of photoresist and comprising circular islands or holes and the roughness parameter comprising a standard deviation of variations of a perimeter of the circular islands or holes produced by an exposure of EUV on the exposure wafer;
determining whether a focus of exposure by the EUV source on the exposure wafer is within an acceptable focus range based on the measured roughness parameter; and
performing, in response to a determination that the focus is outside the acceptable focus range, a control task comprising (a) stopping the EUV lithography process, or (b) obtaining focus within the acceptable focus range by iteratively changing the focus of exposure, measuring the roughness parameter and determining whether the roughness parameter is within an acceptable roughness parameter range.

9. The method of claim 8, further comprising
estimating a function representing dependence of the roughness parameter on the focus by exposing the test pattern on a wafer at different foci of exposure and measuring the roughness parameter for each of the different foci of exposure; and
estimating a best focus based on an extremum of the function.

10. The method of claim 9, further comprising exposing the exposure wafer at the estimated best focus.

11. The method of claim 10, wherein the determining whether the focus of exposure is within an acceptable range comprises periodically measuring, in the operation of the EUV lithography apparatus, the roughness parameter for the test pattern on the exposure wafer; and
determining, in the operation of the EUV lithography apparatus, the focus of exposure based on the measured roughness parameter and the function.

12. The method of claim 11, wherein the measuring the roughness parameter is performed once for the exposure wafer or once for a batch of exposure wafers.

13. The method of claim 9, wherein the function comprises a second degree polynomial.

14. The method of claim 8, wherein the acceptable roughness parameter range is from 0.05 nm to 5 nm.

15. The method of claim 8, wherein the test pattern further comprises a line pattern and the roughness parameter comprises a line-width roughness (LWR) of the line pattern calculated using equation 1, the LWR being a root mean square (RMS) of single-line roughness values of lines in the line pattern, wherein the single-line roughness comprises a standard deviation of width values (CD) of a given line measured at distinct points on the given line calculated using equation 2.

16. An apparatus for extreme ultraviolet (EUV) lithography, the apparatus comprising:
a EUV radiation source;
a wafer holder configured to hold a wafer to be exposed to EUV radiation from the EUV radiation source;
a controller configured to control the apparatus for EUV lithography based on a quality of focus of exposure on the wafer;
a metrology unit operatively connected to the controller and configured to measure parameters of a pattern on the wafer; and
a non-transitory computer-readable storage comprising instructions configured to cause the controller to:
cause the metrology unit to measure a roughness parameter comprising a standard deviation of variations of a perimeter of circular islands or holes of test patterns formed of a photoresist and produced by multiple exposures of EUV at different foci of exposure and estimating a function representing a dependence of the roughness parameter on the focus of exposure,
estimate a best focus based on an extremum of the function,
cause the metrology unit to periodically measure the roughness parameter for the test pattern on the wafer obtained by exposing the wafer at the best focus, and
determine an abnormality in focus based on the measured roughness parameter and the function.

17. The apparatus of claim 16, wherein the test pattern further comprises a line pattern and the roughness parameter further comprises a line-width roughness (LWR) of the line pattern calculated using equation 1, the LWR being a root mean square (RMS) of single-line roughness values of lines in the line pattern, wherein the single-line roughness comprises a standard deviation of width values (CD) of a given line measured at distinct points on the given line calculated using equation 2.

18. The apparatus of claim 16, wherein the non-transitory computer-readable storage further comprises instructions configured to cause the controller to perform, in response to a determination that the measured roughness parameter is outside an acceptable roughness parameter range, a predetermined action,
wherein the predetermined action comprises: (a) stopping the apparatus, or (b) obtaining the focus within an acceptable focus range by iteratively changing the focus of exposure, measuring the roughness parameter and determining whether the roughness parameter is within the acceptable roughness parameter range.

19. The apparatus of claim 16, wherein the roughness parameter is measured once for the exposure wafers or once for a batch of exposure wafers.

20. The apparatus of claim 16, wherein the function comprises a second degree polynomial.

* * * * *